(12) United States Patent
You et al.

(10) Patent No.: US 11,630,157 B2
(45) Date of Patent: Apr. 18, 2023

(54) APPARATUS AND METHOD WITH BATTERY STATE ESTIMATION

(71) Applicant: Samsung Electronics Co., Ltd., Suwon-si (KR)

(72) Inventors: Kaeweon You, Hwaseong-si (KR); Sangdo Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 949 days.

(21) Appl. No.: 16/281,438

(22) Filed: Feb. 21, 2019

(65) Prior Publication Data

US 2020/0096572 A1    Mar. 26, 2020

(30) Foreign Application Priority Data

Sep. 20, 2018 (KR) .................. 10-2018-0112973

(51) Int. Cl.
| | | |
|---|---|---|
| *G01R 31/367* | (2019.01) | |
| *G01R 31/3828* | (2019.01) | |
| *G01R 31/3842* | (2019.01) | |
| *G01R 31/388* | (2019.01) | |
| *B60L 53/10* | (2019.01) | |
| *B60L 58/12* | (2019.01) | |
| *G01R 31/36* | (2020.01) | |
| *G06N 3/08* | (2006.01) | |

(52) U.S. Cl.
CPC ............ *G01R 31/367* (2019.01); *B60L 53/11* (2019.02); *B60L 58/12* (2019.02); *G01R 31/3648* (2013.01); *G01R 31/388* (2019.01); *G01R 31/3828* (2019.01); *G01R 31/3842* (2019.01); *G06N 3/08* (2013.01)

(58) Field of Classification Search
None
See application file for complete search history.

(56) References Cited

U.S. PATENT DOCUMENTS

| | | |
|---|---|---|
| 8,054,038 B2 | 11/2011 | Kelty et al. |
| 8,117,857 B2 | 2/2012 | Kelty et al. |
| 8,258,751 B2 | 9/2012 | Esnard |
| 8,508,191 B2 | 8/2013 | Kim et al. |

(Continued)

FOREIGN PATENT DOCUMENTS

| | | |
|---|---|---|
| JP | 10-104324 A | 4/1998 |
| JP | 2015-175854 A | 10/2015 |

(Continued)

OTHER PUBLICATIONS

Extended European Search Report dated Nov. 18, 2019 in corresponding European Patent Application No. 19165428.4. pp. 1-6 (6 pages in English).

*Primary Examiner* — Brent A. Fairbanks
(74) *Attorney, Agent, or Firm* — NSIP Law

(57) ABSTRACT

A processor-implemented method of estimating a state of a battery includes acquiring current information and voltage information of a battery; determining time interval values based on the acquired current information such that current integration values corresponding to the time variation values satisfy a condition; determining voltage values corresponding to the determined time interval values in the acquired voltage information; and determining state information of the battery based on the determined voltage values.

21 Claims, 15 Drawing Sheets

(56) References Cited

U.S. PATENT DOCUMENTS

| | | |
|---|---|---|
| 8,618,775 B2 | 12/2013 | Hermann et al. |
| 8,624,560 B2 | 1/2014 | Ungar et al. |
| 8,961,203 B2 | 2/2015 | Lee |
| 8,972,213 B2 | 3/2015 | Zhang et al. |
| 9,897,664 B2 | 2/2018 | You et al. |
| 2003/0085688 A1 | 5/2003 | Ullrich et al. |
| 2009/0128097 A1 | 5/2009 | Esnard |
| 2010/0036626 A1* | 2/2010 | Kang .................. G01R 31/392 702/63 |
| 2010/0085009 A1* | 4/2010 | Kang .................. H02J 7/0016 324/427 |
| 2010/0280777 A1 | 11/2010 | Jin et al. |
| 2011/0077879 A1 | 3/2011 | Paryani |
| 2011/0257914 A1 | 10/2011 | Tsuchiya |
| 2013/0069660 A1 | 3/2013 | Bernard et al. |
| 2013/0169232 A1* | 7/2013 | Middleton .............. H02J 7/005 324/426 |
| 2015/0127278 A1* | 5/2015 | Yang ................. G01R 31/3648 702/60 |
| 2016/0069964 A1 | 3/2016 | Takahashi et al. |
| 2019/0157891 A1* | 5/2019 | Chemali ............... H02J 7/0091 |
| 2021/0167620 A1* | 6/2021 | Yazami ................ H01M 10/44 |

FOREIGN PATENT DOCUMENTS

| | | | |
|---|---|---|---|
| JP | 2017-143026 A | 8/2017 | |
| JP | 2017-195698 A | 10/2017 | |
| KR | 10-2011-0111018 A | 10/2011 | |
| KR | 10-2017-0050655 A | 5/2017 | |
| KR | 10-2017-0076414 A | 7/2017 | |
| KR | 10-2018-0044123 A | 5/2018 | |
| KR | 10-1866073 B1 | 6/2018 | |

\* cited by examiner

100

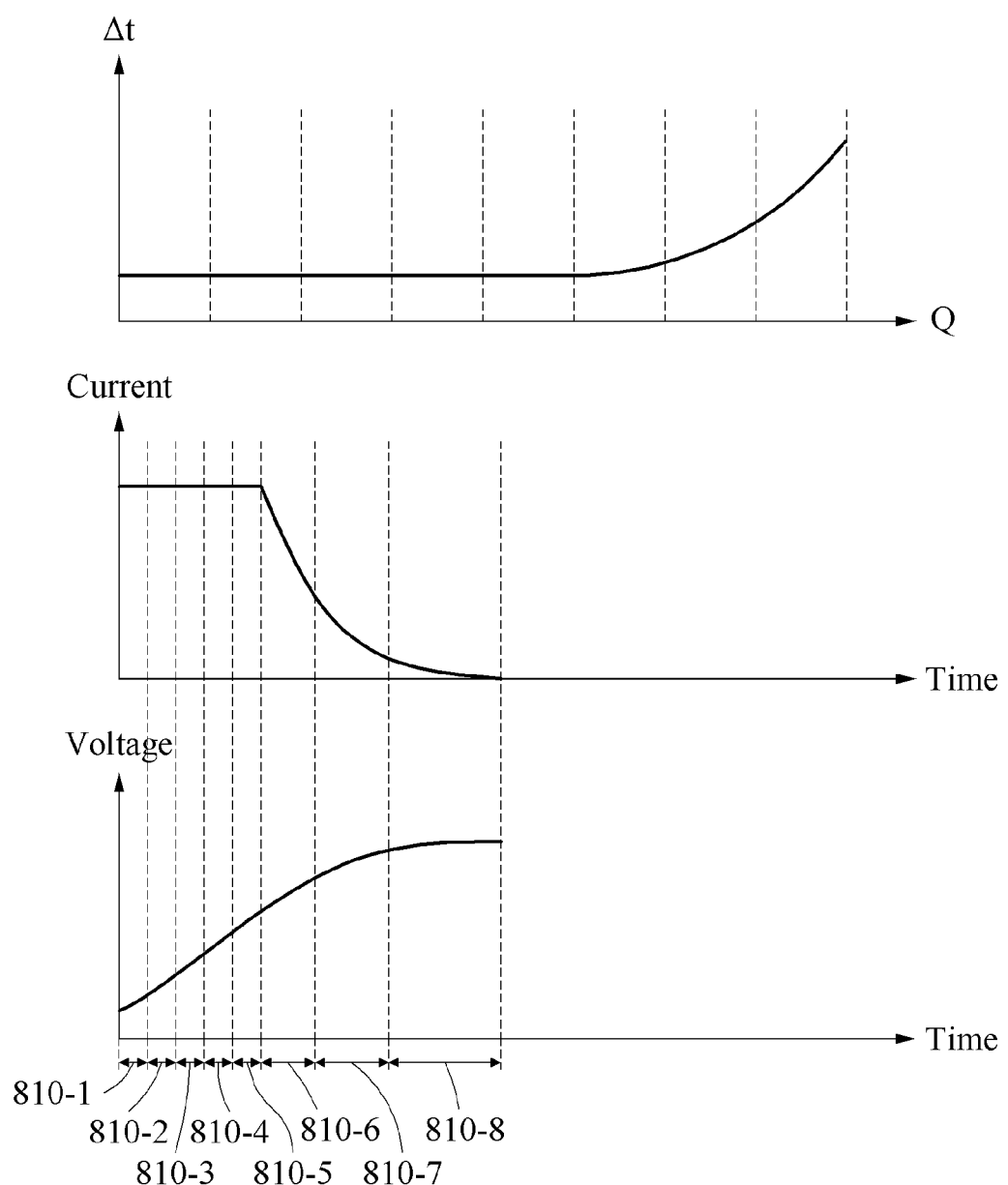

[Slow charging]

APPARATUS AND METHOD WITH BATTERY STATE ESTIMATION

CROSS-REFERENCE TO RELATED APPLICATION(S)

This application claims the benefit under 35 USC § 119(a) of Korean Patent Application No. 10-2018-0112973, filed on Sep. 20, 2018, in the Korean Intellectual Property Office, the entire disclosure of which is incorporated herein by reference for all purposes.

BACKGROUND

1. Field

The following description relates to a battery state estimation apparatus and method.

2. Description of Related Art

A state of a battery may be estimated using various methods. The state of the battery may be estimated using a battery model, for example, an electric circuit model or an electrochemical model.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a processor-implemented method of estimating a state of a battery, the method including: acquiring current information and voltage information of a battery; determining time interval values based on the acquired current information such that current integration values corresponding to the time variation values satisfy a condition; determining voltage values corresponding to the determined time interval values in the acquired voltage information; and determining state information of the battery based on the determined voltage values.

The condition may include the current integration values being equal in value.

The determining of the time interval values may include: acquiring current integration information as an integral of the acquired current information over a time variation; dividing the current integration information at preset intervals to obtain the current integration values; and extracting a time variation value for each dividing point of the current integration values.

The determining of the state information may include: dividing the acquired voltage information based on the determined time interval values.

Among dividing points of the divided voltage information, a time interval between a pair of adjacent dividing points of the voltage information may be greater than another time interval between another pair of adjacent dividing points, and each of the time interval and the other time interval may include one or more of the time interval values.

A current of the battery may decrease in the interval between the portion of dividing points.

The determining of the state information may include: recognizing a voltage variation pattern during a time interval, including two or more of the time interval values, based on the two or more time interval values and voltage values corresponding to the two or more time interval values.

The determining of the state information may include: extracting a voltage value corresponding to one or more time interval values associated with a scan order among the determined time interval values from the acquired voltage information; generating a feature vector based on the one or more time interval values and the extracted voltage value; and inputting the generated feature value to a state estimation model.

The state estimation model may include a recurrent neural network (RNN) including a long short-term memory (LSTM).

A length of the feature vector may be the same in a case in which the battery is fast-charged and in a case in which the battery is slow-charged.

A non-transitory computer-readable storage medium may store instructions that, when executed by one or more processors, cause the one or more processors to perform the method.

In another general aspect, there is provided an apparatus for estimating a state of a battery, the apparatus including: one or more processors configured to: acquire current information and voltage information of a battery, determine time interval values based on the acquired current information such that current integration values corresponding to the time variation values satisfy a condition, determine voltage values corresponding to the determined time interval values in the acquired voltage information, and determine state information of the battery based on the determined voltage values.

The condition may include the current integration values being equal in value.

The one or more processors may be configured to: acquire current integration information as an integral of the acquired current information over a time variation, divide the current integration information at preset intervals to obtain the current integration values, and extract a time variation value for each dividing point of the current integration values.

The one or more processors may be configured to divide the acquired voltage information based on the determined time interval values.

Among dividing points of the divided voltage information, a time interval between a pair of adjacent dividing points of the voltage information may be greater than another time interval between another pair of adjacent dividing points, and each of the time interval and the other time interval may include one or more of the time interval values.

A current of the battery may decrease in the interval between the portion of dividing points.

The one or more processors may be configured to recognize a voltage variation pattern during a time interval, including two or more of the time interval values, based on the two or more time interval values and voltage values corresponding to the two or more time interval values.

The one or more processors may be configured to: extract a voltage value corresponding to one or more time interval values associated with a scan order among the determined time interval values from the acquired voltage information, generate a feature vector based on the one or more time interval values and the extracted voltage value, and input the generated feature value to a state estimation model.

The state estimation model may be based on a recurrent neural network (RNN) including a long short-term memory (LSTM).

A length of the feature vector may be the same in a case in which the battery is fast-charged and in a case in which the battery is slow-charged.

In another general aspect, there is provided a processor-implemented method of estimating a state of a battery, the method including: acquiring current information and voltage information of a battery; determining, based on the current information, current integration values that are equal in value; determining time interval values based on the determined current integration values; and determining state information of the battery based on voltage values corresponding to the determined time interval values in the acquired voltage information.

The determining of the state information of the battery may include: generating a feature vector based on one or more time interval values, of the time interval values, and one or more first corresponding voltage values, of the voltage values; inputting the feature vector into a long short-term memory (LSTM) to generate an LSTM output vector; generating a subsequent feature vector based on one or more subsequent time interval values, of the time interval values, and one or more subsequent corresponding voltage values, of the voltage values; inputting the LSTM output vector and the subsequent feature vector into the LSTM to generate a subsequent LSTM output vector; and determining state information of the battery by applying a regression analysis to the subsequent LSTM output vector.

In another general aspect, there is provided a processor-implemented method of estimating a state of a battery, the method including: acquiring current and voltage information of a battery; determining time interval values and corresponding voltage values based on the acquired current and voltage information and based on a charging rate of the battery; and determining state information of the battery based on the time interval values and the corresponding voltage values.

The determining of the time interval values and the corresponding voltage values may include: determining the time interval values to be greater for a slower charging rate of the battery than for a faster charging rate of the battery.

Other features and aspects will be apparent from the following detailed description, the drawings, and the claims.

BRIEF DESCRIPTION OF THE DRAWINGS

FIG. 8A illustrates an example of a battery state estimation apparatus operating when a battery is fast-charged.

Figure 1:
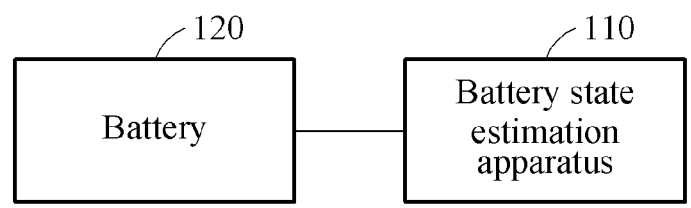
FIGS. 1 and 2 illustrate examples of battery management apparatuses.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after gaining a thorough understanding of the disclosure of this application. For example, the sequences of operations described herein are merely examples, and are not limited to those set forth herein, but may be changed as will be apparent after such thorough understanding of the disclosure of this application has been gained, with the exception of operations necessarily occurring in a certain order. Also, descriptions of functions and constructions may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Various modifications may be made to examples. However, it should be understood that these examples are not construed as limited to the illustrated forms and include all changes, equivalents or alternatives within the idea and the technical scope of this disclosure.

The terminology used herein is for the purpose of describing particular examples only and is not intended to be limiting of examples. As used herein, the singular forms are intended to include the plural forms as well, unless the context clearly indicates otherwise. It should be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Unless otherwise defined herein, all terms used herein including technical or scientific terms have the same meanings as those generally understood by one of ordinary skill in the art after an understanding of the disclosure of the present application. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Regarding the reference numerals assigned to the elements in the drawings, it should be noted that the same elements will be designated by the same reference numerals, wherever possible, even though they are shown in different drawings. Also, in describing of examples, detailed description of well-known related structures or functions will be omitted when it is deemed that such description will cause ambiguous interpretation of the present disclosure.

Figure 2:
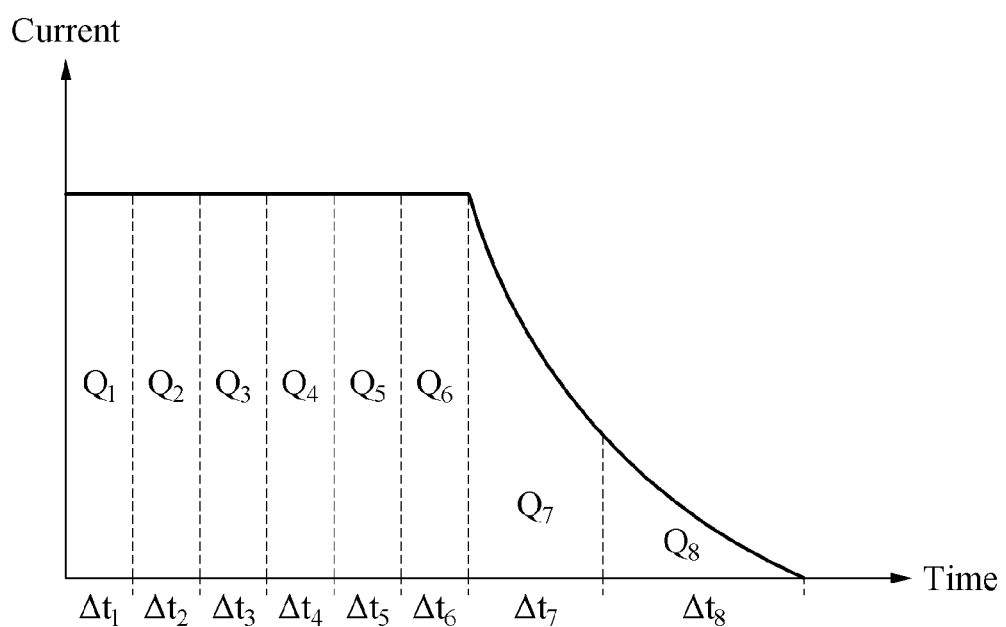

FIGS. 1 and 2 illustrate examples of battery management apparatuses.

Referring to FIG. 1, a battery system 100 includes a battery state estimation apparatus 110 and a battery 120.

The battery 120 may be one or more of, for example, a battery cell, a battery module, and a battery pack.

The battery state estimation apparatus 110 may acquire sensing information of the battery 120. The sensing information may include, for example, voltage information and current information. The sensing information may correspond to sensing information acquired while the battery 120 is charged or sensing information acquired while the battery 120 is discharged.

The battery state estimation apparatus 110 determines time variation values (e.g., time interval values) based on acquired current information. As non-limiting examples, the battery state estimation apparatus 110 may determine an integration value of a portion of the current curve of FIG. 2 as equal to the integral of the portion of the current curve, which may also equal the corresponding area under the portion of the current curve. The battery state estimation apparatus 110 may determine the time variation values such that a current integration value for each of the time variation values satisfies a condition. That is, the battery state estimation apparatus 110 may determine the time variation values based on the current integration values and a condition applied to the current integration values. In the example of FIG. 2, the battery state estimation apparatus 110 determines time variation values $\Delta t_1$, through $\Delta t_8$ such that the time variation values $\Delta t_1$ through $\Delta t_8$ correspond to the same current integration value. For example, the battery state estimation apparatus determines the time variation values $\Delta t_1$, through $\Delta t_8$ such that the current integration values $Q_1$ through $Q_8$ are the same as one another. For example, current integration value $Q_6$ (or the area of $Q_6$ shown in FIG. 2) may be equal to current integration value $Q_8$ (or the area of $Q_8$ shown in FIG. 2). Related description will be described with reference to FIGS. 3 through 5.

Figure 6:
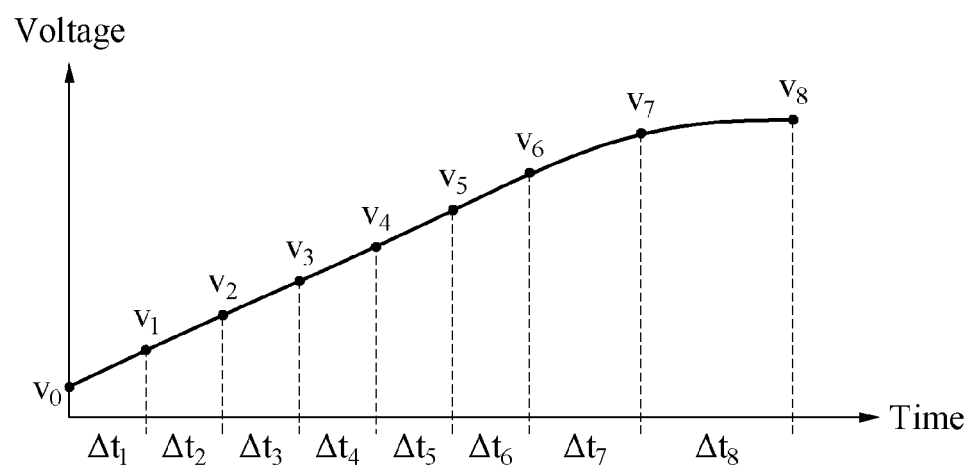

The battery state estimation apparatus 110 determines state information of the battery 120 based on the determined time variation values and voltage values corresponding to the determined time variation values in the acquired voltage information. Related description will be described with reference to FIGS. 6 and 7. The state information includes, but not be limited to, a state of charge (SOC) and/or a state of health (SOH).

FIGS. 3 through 7 illustrate examples of operations of battery state estimation apparatuses.

Figure 3:
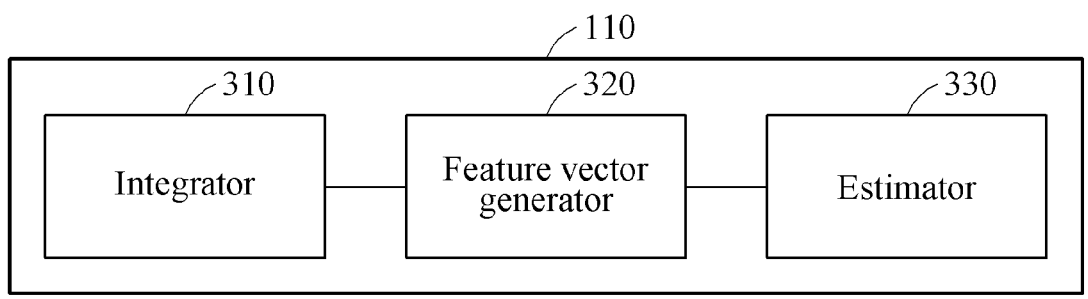
FIGS. 3 through 7 illustrate examples of operations of battery state estimation apparatuses.

Referring to FIG. 3, the battery state estimation apparatus 110 may include an integrator 310, a feature vector generator 320, and an estimator 330, for example.

The integrator 310 determines time variation values based on current information of the battery 120. In an example, current integration values corresponding to the time variation values may be the same as one another. The current information of the battery 120 may correspond to current information acquired while the battery 120 is charged or current information acquired while the battery 120 is discharged. Battery 120 is combinable with aspects of integrator 310, a feature vector generator 320, and an estimator 330, with examples not limited thereto. Further, battery 120 may be included in the battery state estimation apparatus 110, with examples not limited thereto.

The integrator 310 may obtain integration information indicating a relationship between a current integration and a time variation based on the current information of the battery 120, divide the obtained integration information (or, for example, the current integration) at preset intervals, and extract time variation values of dividing points of the current integration from the obtained integration information. The extracted time variation values may be determined as time variation values for voltage information of the battery 120.

Figure 4:
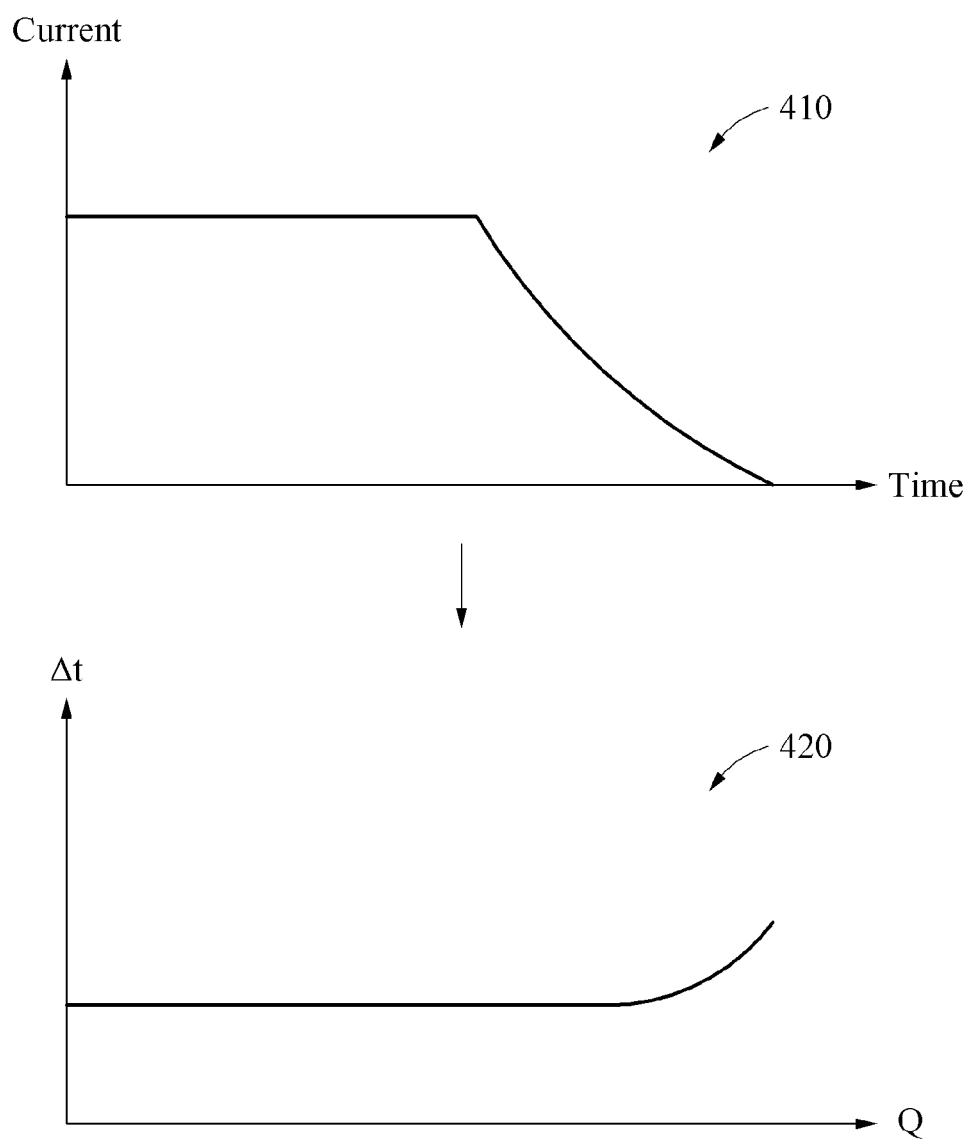
Figure 5:
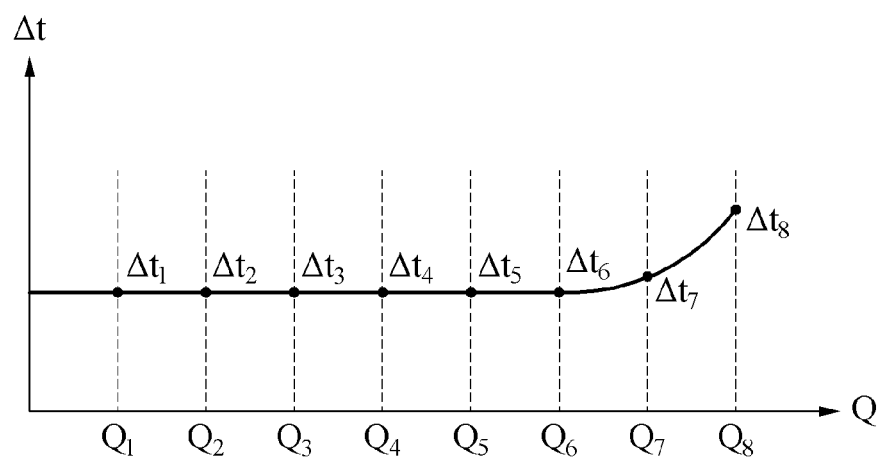

In the example of FIG. 4, the integrator 310 uses current information 410 to obtain integration information 420 of which an x axis is a current integration Q and a y axis is a time variation $\Delta t$. In this example, Q corresponds to $\int I(t)dt$ (e.g., the integral of current with respect to time) and I(t) corresponds to the current information 410. The integrator 310 divides the current integration Q included in the integration information 420 at preset intervals. A number of portions into which the current integration Q is divided by the integrator 310 may be determined in advance. In the example of FIG. 5, the integrator 310 divides the current integration Q into eight portions (e.g., into eight portions of equal in value). In this example, the current integration Q is divided at preset intervals. In other words, $Q_1$, a difference between $Q_2$ and $Q_1$, a difference between $Q_3$ and $Q_2$, ..., a difference between $Q_8$ and $Q_7$ are the same as one another. The integrator 310 extracts time variation values corresponding to dividing points of the current integration Q. The integrator 310 extracts the time variation value $\Delta t_1$, of $Q_1$, the time variation value $\Delta t_2$ of $Q_2$, ..., the time variation value $\Delta t_8$ of $Q_8$. The extracted time variation values $\Delta t_1$ through $\Delta t_8$ correspond to time variation values for voltage information of the battery 120. The extracted time variation values $\Delta t$ may therefore be the same or may be different from each other, depending on their corresponding Q values. For example, $\Delta t_1$ or $\Delta t_2$ may be shorter than $\Delta t_7$ or $\Delta t_8$.

Although the number of portions is 8 in the example of FIG. 5, the number of portions is not limited to the example, as the number of portions may also be less than 8 or greater than 8.

Referring back to FIG. 3, the feature vector generator 320 processes the voltage information of the battery 120 based on the time variation values determined by the integrator 310. The feature vector generator 320 divides the voltage information of the battery 120 based on the determined time variation values. In an example, such as demonstrated in FIG. 6, the feature vector generator 320 receives the time variation values $\Delta t_1$ through $\Delta t_8$ from the integrator 310. The feature vector generator 320 divides the voltage information of the battery 120 based on the time variation values $\Delta t_1$ through $\Delta t_8$. In this example, an interval between a portion of dividing points of the voltage information is greater than an interval between another portion of dividing points of the voltage information. For example, the time variation value $\Delta t_7$ may be greater than the time variation values $\Delta t_1$ through $\Delta t_6$, and the time variation value $\Delta t_8$ may be greater than the time variation values $\Delta t_1$ through $\Delta t_7$.

The feature vector generator 320 inputs, for each scan turn or each scan interval, a feature vector including at least one time variation value associated with the corresponding scan turn and a voltage value corresponding to the at least one time variation value, to the estimator 330. The estimator 330 recognizes a variation pattern of the feature vector input for each scan turn. The estimator 330 includes, for example, a state estimation model trained to recognize a variation pattern of an input. Related description will be provided with reference to FIG. 14. The state estimation model includes, but not be limited to a long short term memory (LSTM) nodes, configured as a recurrent neural network (RNN).

Figure 7:
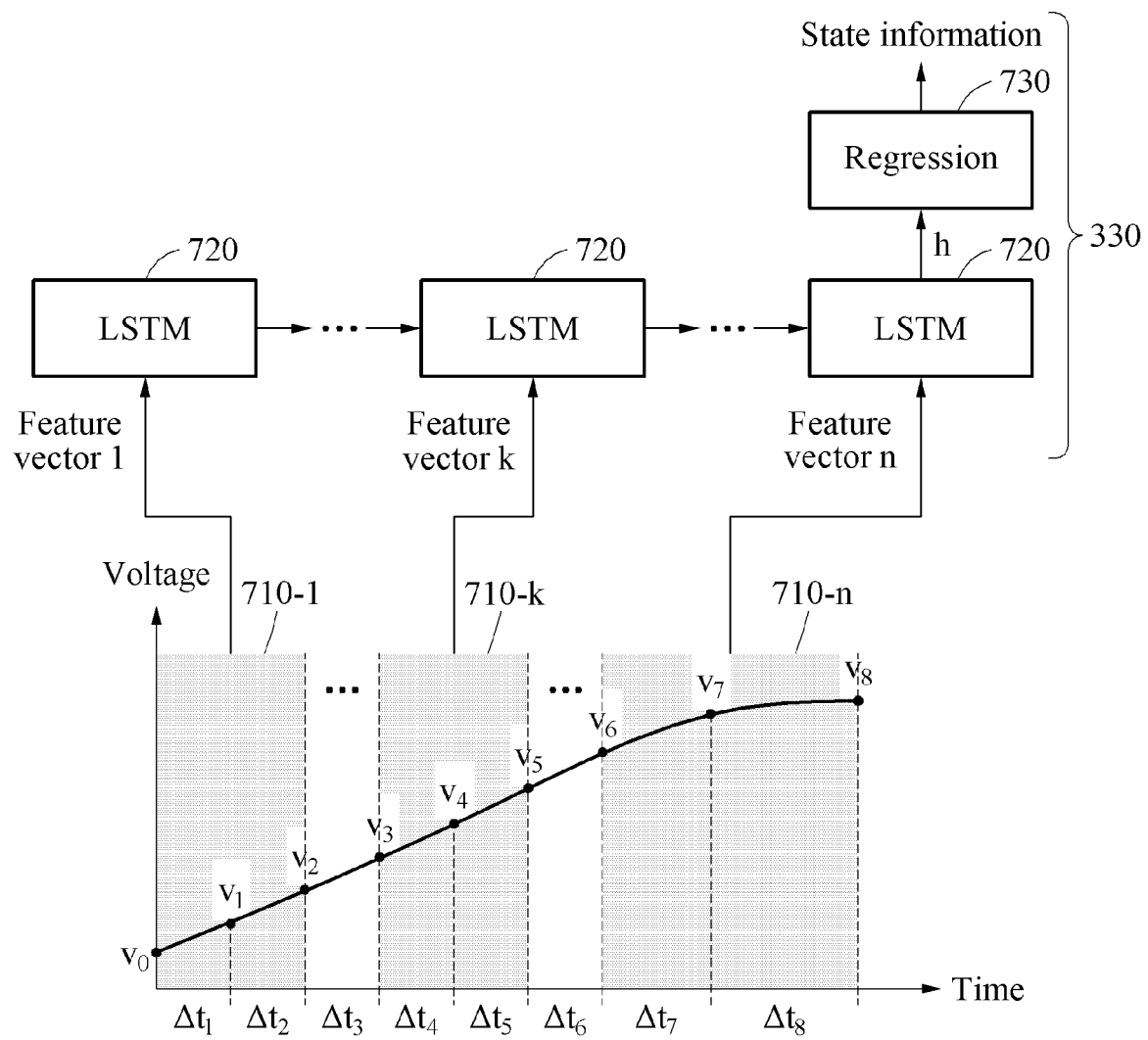

In the example of FIG. 7, at a scan turn 1 710-1, the feature vector generator 320 extracts voltage values $v_0$, $v_1$, and $v_2$ corresponding to the time variation values $\Delta t_1$ and $\Delta t_2$. The feature vector generator 320 generates a feature vector 1 including the voltage values $v_0$, $v_1$, and $v_2$ and the time variation values $\Delta t_1$, and $\Delta t_2$, and inputs the feature vector 1 to the estimator 330. An LSTM layer 720 of the estimator 330 recognizes a variation pattern of the feature vector 1. The LSTM layer 720 of the estimator 330 recognizes what variation patterns the voltage values $v_0$, $v_1$, and $v_2$ have during a time interval (for example, $\Delta t_1 + \Delta t_2$) based on the time variation values $\Delta t_1$ and $\Delta t_2$. An output of the LSTM layer 720 at the scan turn 1 710-1 is input to the LSTM layer 720 (e.g., input into itself or the same LSTM layer 720) in a subsequent scan turn, as part of the recurrent configuration of the RNN. The output of the LSTM layer 720 at the scan turn 1 may include a recognition result of the variation pattern of the feature vector 1.

At an eventual scan turn k 710-$k$, the feature vector generator 320 inputs a feature vector k including voltage values $v_3$, $v_4$, and $v_5$ and the time variation values $\Delta t_4$ and $\Delta t_5$ to the LSTM layer 720. The LSTM layer 720 recognizes variation patterns of the voltage values $v_3$, $v_4$, and $v_5$ during a time interval based on the time variation values $\Delta t_4$ and $\Delta t_5$. An output including the corresponding recognition result is input to the LSTM layer 720 (e.g., input into itself or the same LSTM layer 720) in a subsequent scan turn.

As an eventual last turn n, the feature vector generator 320 inputs a feature vector n including voltage values $v_6$, $v_7$, and $v_8$ and the time variation values $\Delta t_7$ and $\Delta t_8$ to the LSTM layer 720. The LSTM layer 720 recognizes variation patterns of the voltage values $v_6$, $v_7$, and $v_8$ during a time interval based on the time variation values $\Delta t_7$ and $\Delta t_8$. As the last turn n, the LSTM layer 720 outputs a final vector h including the corresponding recognition result.

The estimator 330 performs a regression analysis 730 on the final vector h to determine state information of the battery 120. The regression analysis may be performed by another neural network layer(s).

The method of determining, by the battery state estimation apparatus 110, state information of the battery 120 during charging are described with reference to FIGS. 3 through 7. However, the present examples are not to be taken as being limited thereto. The description made with reference to FIGS. 3 through 7 may also be applicable to the battery state estimation apparatus 110 determining state information of the battery 120 during discharging.

Figure 8B:
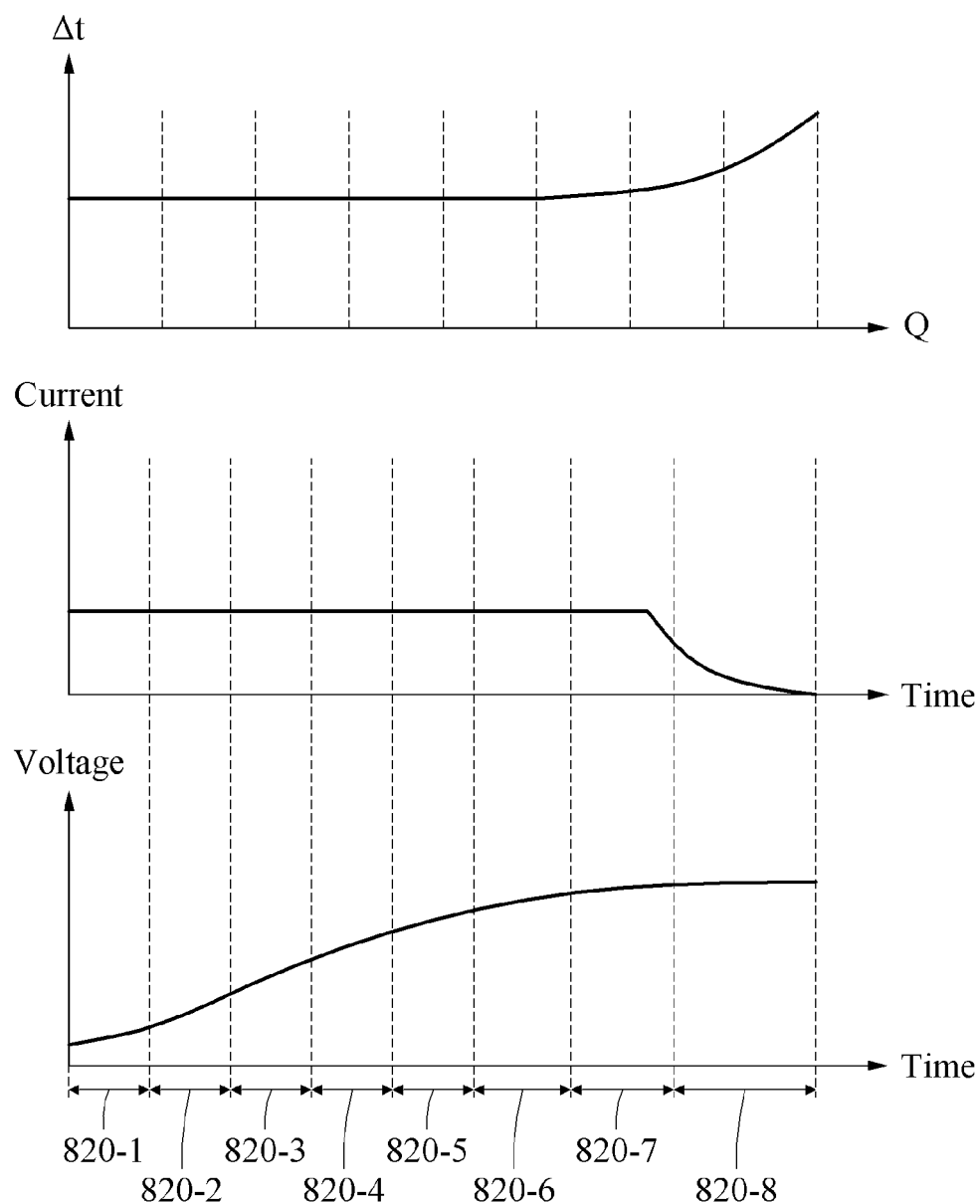
FIG. 8B illustrates an example of a battery state estimation apparatus operating when a battery is slow-charged.

FIG. 8A illustrates an example of a battery state estimation apparatus operating when a battery is fast-charged. FIG. 8B illustrates an example of a battery state estimation apparatus operating when a battery is slow-charged.

Referring to FIGS. 8A and 8B, the battery state estimation apparatus 110 may equally divide the current integration Q. In the example of FIG. 8A, a length of each of intervals 810-6 through 810-8 in which a current is reduced may be greater than a length of each of intervals 810-1 through 810-5. In the example of FIG. 8B, a length of each of intervals 820-7 and 820-8 in which a current is reduced may be greater than a length of each of intervals 820-1 through 820-6. Further, a length of interval 820-1 may be greater than a length of interval 810-1, a length of interval 820-2 may be greater than a length of interval 810-2, a length of interval 820-3 may be greater than a length of interval 810-3, a length of interval 820-4 may be greater than a length of interval 810-4, a length of interval 820-5 may be greater than a length of interval 810-5, a length of interval 820-6 may be greater than a length of interval 810-6, a length of interval 820-7 may be greater than a length of interval 810-7, and/or a length of interval 820-8 may be greater than a length of interval 810-8, etc.

When a current integration quantity of the battery 120 is the same in a case in which the battery 120 is fast-charged and in a case in which the battery 120 is slow-charged, a length of a feature vector of the battery 120 may also be the same as in the case in which the battery 120 is fast-charged and in the case in which the battery 120 is slow-charged. That is, while a voltage change may be greater for fast charging than for slow charging (for a same time interval), a time interval of a feature vector for fast charging the battery 120 may be shorter than a time interval of a feature vector for slow charging the battery 120, and therefore a voltage variation of a feature vector for fast charging the battery 120 may be the same or similar to a voltage variation of a feature vector for slow charging the battery 120. Accordingly, the feature vector for fast charging the battery 120 may have the same length as the feature vector for slow charging the battery 120. Accordingly, when the same quantity of current is accumulated for both the fast charging and the slow charging, for example, a same speed of calculating state information may be maintained irrespective of a length of charging. Accordingly, the battery state estimation apparatus and method of the present application may improve upon previous battery state estimation apparatuses and methods, at least because such previous technologies were not as effective for determining battery state for both fast charging and slow charging, and were instead respectively configured for determining battery state for only one of either fast charging or slow charging, but not efficient in determining both. That is, a previous battery state estimation apparatus and method may have determined feature vectors based on short time intervals, thereby determining battery state for fast charging. However, such short time intervals, when applied to slow charging, would result in an unnecessarily large number of feature vectors, and therefore a number of calculations performed to determine battery state would be unnecessarily large, and thus a processing speed of the battery state estimation apparatus (or computing devices on which the battery state estimation method was implemented) would be reduced. Vice versa, a previous battery state estimation apparatus and method may have determined feature vectors based on long time intervals, thereby potentially avoiding an unnecessarily large number of feature vectors for slow charging. However, such long time intervals result in an insufficient amount of feature vectors for a fast charging battery state to accurately be determined. Thus, there are technological problems in the technological environment of battery state management, which includes battery state estimation which may be overcome or avoided through one or more example embodiments herein.

For example, battery state estimation or determinations of the battery 120 may be insignificantly different in the case in which the battery 120 is fast-charged and in the case in which the battery 120 is slow-charged, and accuracies of the battery state determinations of the battery 120 may be high. In other words, in an example, irrespective of a charging speed of the battery 120, the battery state estimation apparatus 110 may maintain a state estimation of high performance and high accuracy.

Referring to FIGS. 8A and 8B, voltage information of the battery 120 is divided into larger intervals in the case in which the battery 120 is slow-charged in comparison the case in which the battery 120 is fast-charged. In an example, a voltage variation in each of the intervals 820-1 through 820-8 of FIG. 8B may be as large as a voltage variation in each of the intervals 810-1 through 810-8 of FIG. 8A. Thus, the battery state estimation apparatus 110 may accurately recognize a voltage variation pattern of each of the intervals 820-1 through 820-8 of FIG. 8B. Through this, the battery state estimation apparatus 110 maintains the state estimation performance of a fast-charging state even in a slow-charging state.

Figure 9:
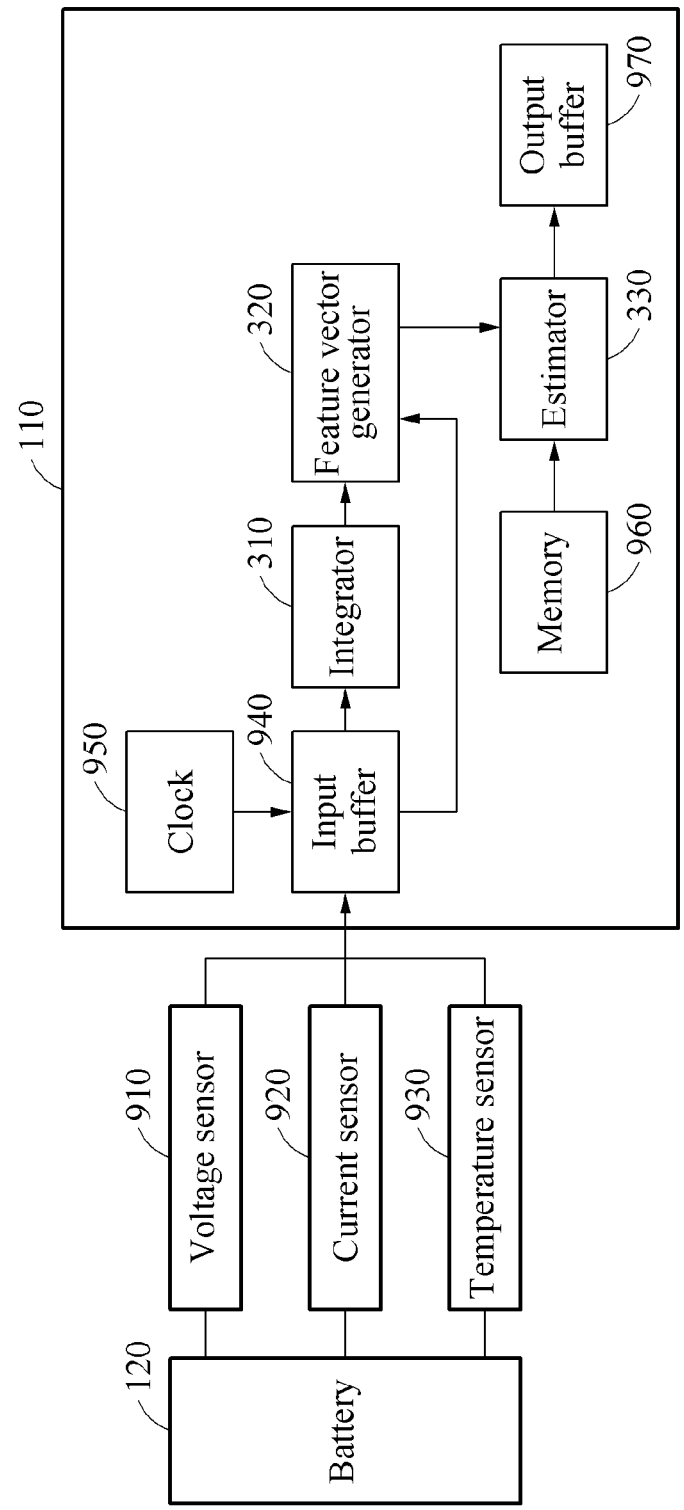
FIG. 9 illustrates an example of a battery system.

FIG. 9 illustrates an example of a battery system.

Referring to FIG. 9, the battery system 100 includes the battery 120, sensors 910 through 930, and the battery state estimation apparatus 110. In an example, the battery system may also be a vehicle, such as vehicle 1200 in FIG. 12. In an example, the sensors 910 through 930 and the battery state estimation apparatus 110 may also correspond to a battery management system (BMS) of such a vehicle 1200.

In the example of FIG. 9, the battery state estimation apparatus 110 includes a clock 950, an input buffer 940, the integrator 310, the feature vector generator 320, the estimator 330, a memory 960, and an output buffer 970. The input buffer 940 and the output buffer 970 are physically separated from each other or logically separated in a single buffer.

A voltage sensor, for example, the sensor 910 senses a voltage of the battery 120 and stores voltage information in the input buffer 940. A current sensor, for example, the sensor 920 senses a current of the battery 120 and stores current information in the input buffer 940. A temperature sensor, for example, the sensor 930 senses a temperature of the battery 120 and stores temperature information in the input buffer 940.

The clock 950 records a time at which sensing information of the sensors 910 through 930 is stored in the input buffer 940.

The integrator 310 receives the current information from the input buffer 940 and determines time variation values based on the current information. The above description regarding determining time variation values based on the current information may be applicable here and thus, a detailed description will be omitted.

The feature vector generator 320 receives the voltage information from the input buffer 940 and divides the voltage information based on the determined time variation values. The feature vector generator 320 receives the temperature information from the input buffer 940 and divides the temperature information based on the determined time variation values. The description made for a voltage information division is also applicable to an example temperature information division and thus, a detailed description will be omitted.

The feature vector generator 320 inputs a feature vector to the estimator 330 for each scan turn. As described above, the feature vector for each scan turn includes at least one time variation value associated with the corresponding scan turn and a voltage value corresponding to the at least one time variation. Depending on various implementation examples, the feature vector for each scan turn may further include a temperature value corresponding to the at least one time variation value.

The estimator 330 applies at least one parameter included in the memory 960 to a state estimation model and determines state information of the battery 120 based on the feature vector corresponding to each scan turn and the state estimation model. The description made with reference to FIG. 7 may be applicable to an operation of the estimator 330 and thus, a detailed description will be omitted.

The description made above with reference to FIGS. 1 through 8 may be applicable to the example of FIG. 9 and a detailed description is omitted.

Figure 10:
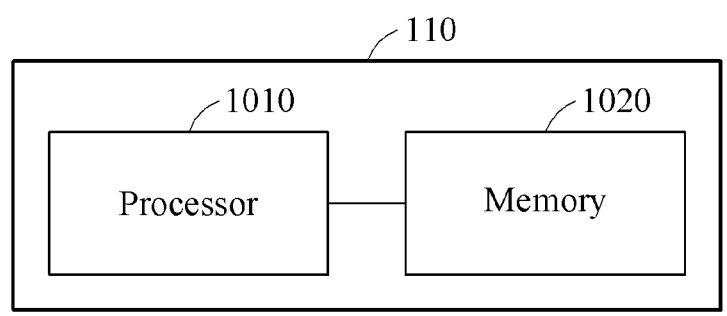
FIG. 10 illustrates an example of a battery state estimation apparatus.

FIG. 10 illustrates an example of a battery state estimation apparatus.

Referring to FIG. 10, the battery state estimation apparatus 110 includes a processor 1010 and a memory 1020.

In such an example, the processor 1010 respectively includes or implements the integrator 310, the feature vector generator 320, and the estimator 330 for example. The processor 1010 acquires current information and voltage information of the battery 120, and determines time variation values based on the acquired current information. In this example, the processor 1010 determines the time variation values such that current integration values corresponding to the time variation values satisfy a condition. The processor 1010 determines state information of the battery 120 based on the determined time variation values and voltage values corresponding to the determined time variation values in the acquired voltage information.

The memory 1020 includes instructions, which when executed by the processor 1010, may configure the processor to perform any one, any combination, or all operations described herein.

The memory 1020 may include a non-transitory computer-readable storage media or a non-transitory computer-readable storage device. The memory 1020 may include, for example, non-volatile memory such as random access memories (RAM), dynamic random access memories (DRAM), static random access memories (SRAM), and the like.

The memory 1020 may correspond to the memory 960 described with reference to FIG. 9.

The description made above with reference to FIGS. 1 through 9 may be applicable to the example of FIG. 10 and a detailed description is omitted.

Figure 11:
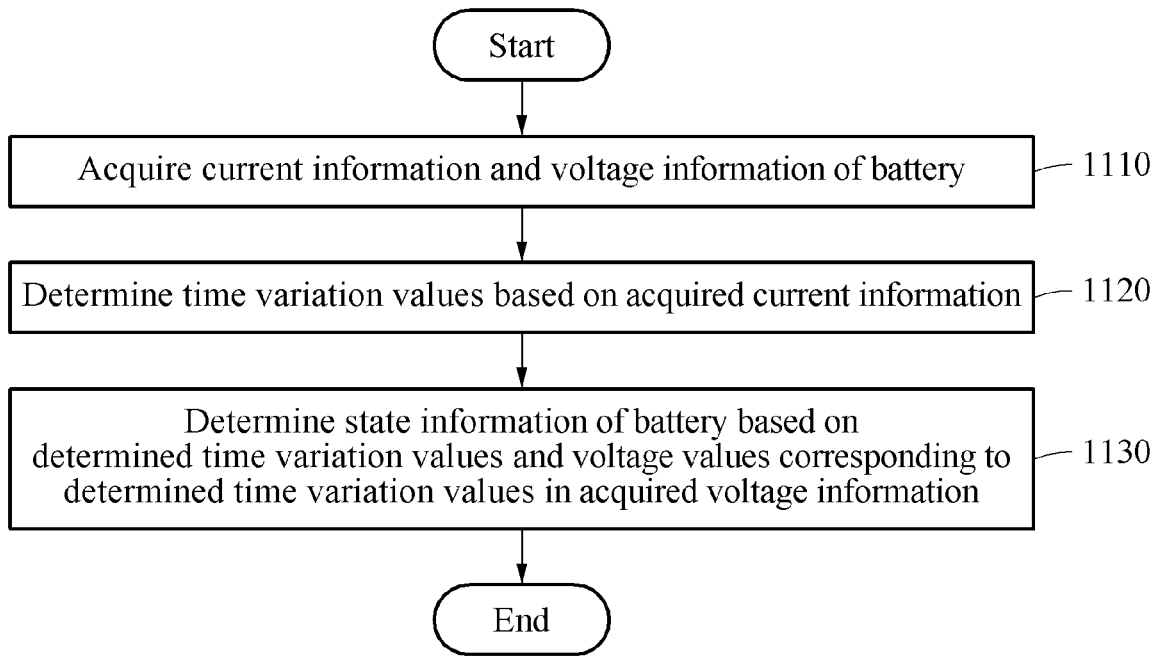
FIG. 11 illustrates an example of a battery state estimation method.

FIG. 11 illustrates an example of a battery state estimation method.

The battery state estimation method of FIG. 11 is performed by the battery state estimation apparatus 110.

Referring to FIG. 11, in operation 1110, the battery state estimation apparatus 110 acquires current information and voltage information of the battery 120.

In operation 1120, the battery state estimation apparatus 110 determines time variation values based on the acquired current information. In this example, the battery state estimation apparatus 110 determines the time variation values such that current integration values corresponding to the time variation values satisfy a condition.

In operation 1130, the battery state estimation apparatus 110 determines state information of the battery 120 based on the determined time variation values and voltage values corresponding to the determined time variation values in the acquired voltage information.

The description made above with reference to FIGS. 1 through 10 may be applicable to the example of FIG. 11 and a detailed description is omitted.

In an example, the battery state estimation apparatus 110 may determine state information of each of a plurality of batteries. In this example, the description made about the method of determining state information of the battery 120 using the battery state estimation apparatus 110 with reference to FIGS. 1 through 11 may be applicable to a method of determining state information of the plurality of batteries using the battery state estimation apparatus 110 and thus, a detailed description will be omitted.

The battery state estimation apparatus 110 may be included in various apparatuses (for example, a vehicle, a walking assistance device, a drone, and a mobile terminal) that use batteries as a power source or included in an energy storage system (ESS). The battery state estimation apparatus 110 performs the operations described with reference to FIG. 1 through 11. Hereinafter, examples of the battery state estimation apparatus 110 in a vehicle will be described with reference to FIGS. 12 and 13. The following description is also applicable to other apparatuses in addition to the vehicle.

Figure 12:
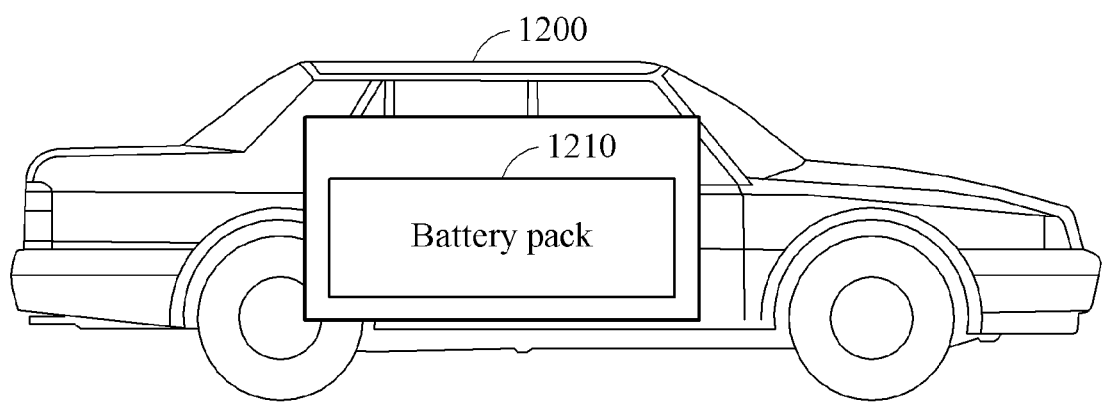
FIGS. 12 and 13 illustrate examples of vehicles.
Figure 13:
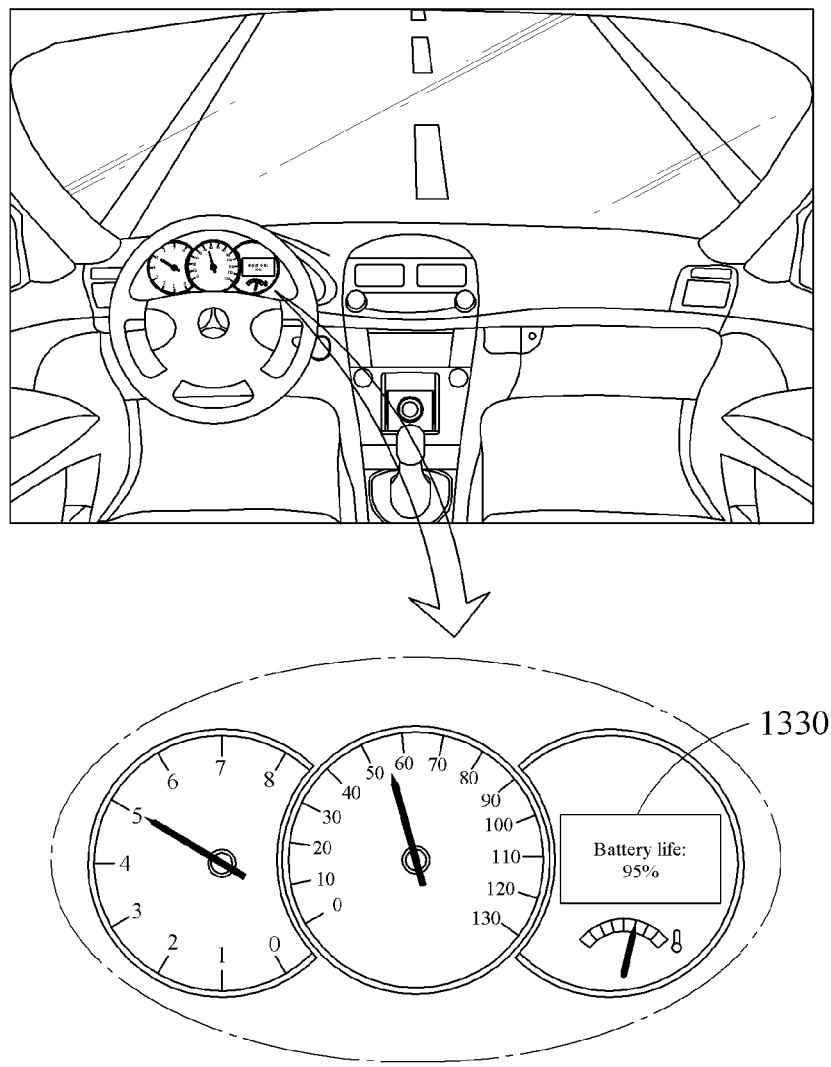

FIGS. 12 and 13 illustrate examples of vehicles.

Referring to FIG. 12, a vehicle 1200 includes a battery pack 1210. The vehicle 1200 is, for example, an electric vehicle or a hybrid vehicle.

The battery pack 1210 includes a BMS, and battery cells or at least one battery module. The BMS monitors whether an abnormality occurs in the battery pack 1210 and may prevent the battery pack 1210 from being overcharged or over-discharged. The BMS performs a thermal control on the battery pack 1210 when a temperature of the battery pack 1210 is higher than a first temperature, for example, 40 degrees Celsius (° C.) or is lower than a second temperature, for example, −10° C. The BMS performs a cell balancing such that states of charge of the battery cells in the battery pack 1210 are equalized.

The BMS includes the battery state estimation apparatus 110. The battery state estimation apparatus 110 determines state information of each of the battery cells in the battery pack 1210. The battery state estimation apparatus 110 determines a maximum value, a minimum value, or a mean value of the state information of the batteries cells to be state information of the battery pack 1210.

The battery state estimation apparatus 110 determines state information of the battery pack 1210 or state information of each of the battery cells included in the battery pack 1210 when the battery pack 1210 is fully or partially charged. Also, the battery state estimation apparatus 110 determines state information of the battery pack 1210 or state information of each of the battery cells included in the battery pack 1210 when the battery pack 1210 is fully or partially discharged.

The BMS transmits the state information of the battery pack 1210 to an electronic control unit (ECU) or a vehicle control unit (VCU) of the vehicle 1200. The ECU or the VCU displays the state information of the battery pack 1210 on a display of the vehicle 1200. As illustrated in FIG. 13, the ECU or the VCU displays state information 1330 of the battery pack 1210 on a dashboard of the vehicle 1200. Although not shown in FIG. 3, the ECU or the VCU may display the state information 1330 of the battery pack 1210 on a head-up display of the vehicle 1200.

The description made above with reference to FIGS. 1 through 11 may be applicable to the examples of FIGS. 12 and 13 and a detailed description is omitted.

Figure 14:
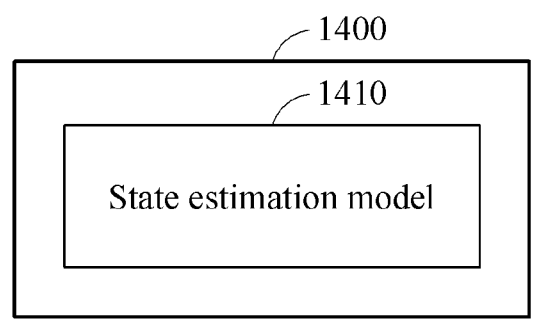
FIG. 14 illustrates an example of a training apparatus.

FIG. 14 illustrates an example of a training apparatus.

Referring to FIG. 14, a training apparatus 1400 includes a state estimation model 1410.

The training apparatus 1400 extract a charging interval from overall sensing information of a battery of the same type as the battery 120. The training apparatus 1400 extracts current information corresponding to the charging interval of overall current information of the battery and extracts voltage information corresponding to the charging interval from overall voltage information of the battery.

The training apparatus 1400 performs an operation similar to the aforementioned operations of the integrator 310 and the feature vector generator 320. The training apparatus 1400 determines time variation values based on the extracted current information, divides the extracted voltage information based on the time variation values, and generates feature vectors based on the time variation values and the divided voltage information.

The training apparatus 1400 trains the state estimation model 1410 using the feature vectors. As described above, the state estimation model 1410 corresponds to, but not be limited to, an RNN including an LSTM. Through such training, the training apparatus 1400 optimizes at least one parameter of the state estimation model 1410. The optimized parameter is stored in the memory 960 or the memory 1020 of the battery state estimation apparatus 110.

The battery system 100, the battery state estimation apparatus 110, the battery 120, the battery state estimation apparatus 110, the integrator 310, the feature vector generator 320, the estimator 330, the LSTM layer 720, the regression analysis 730, the sensors 910 through 930, the input buffer 940, the clock 950, the memory 960, the output buffer 970, the processor 1010, the memory 1020, the vehicle 1200, the battery pack 1210, the training apparatus 1400, the state estimation model 1410, apparatuses, units, modules, devices, and other components described herein with respect to FIGS. 1 through 14 are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1 through 14 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions used herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A processor-implemented method of estimating a state of a battery, the method comprising:
    acquiring current information and voltage information of a battery;
    determining time interval values based on the acquired current information such that current integration values corresponding to the time interval values satisfy a condition, wherein the current integration values are equal to each other, and at least one of the time interval values is non-equal to others of the time interval values;
    determining voltage values corresponding to the determined time interval values in the acquired voltage information;
    recognizing a voltage variation pattern during a time interval, including two or more of the time interval values, based on the two or more time interval values and voltage values corresponding to the two or more time interval values;
    determining state information of the battery using the recognized voltage variation pattern based on the determined voltage values; and
    outputting the determined state information to a display.

2. The method of claim 1, wherein the determining of the time interval values comprises:
    acquiring current integration information as an integral of the acquired current information over times;
    dividing the current integration information to obtain the current integration values; and
    extracting a corresponding time interval value for each dividing point of the current integration values.

3. The method of claim 1, wherein the determining of the state information comprises:
    dividing the acquired voltage information based on the determined time interval values.

4. The method of claim 3,
    wherein, among dividing points of the divided voltage information, a time interval between a pair of adjacent dividing points of the voltage information is greater than another time interval between another pair of adjacent dividing points, and
    wherein each of the time interval and the other time interval comprises one or more of the time interval values.

5. The method of claim 4, wherein a current of the battery decreases in the interval between the portion of dividing points.

6. The method of claim 1, wherein the determining of the state information comprises:
- extracting a voltage value corresponding to one or more time interval values associated with a scan order among the determined time interval values from the acquired voltage information;
- generating a feature vector based on the one or more time interval values and the extracted voltage value; and
- inputting the generated feature value to a state estimation model.

7. The method of claim 6, wherein the state estimation model comprises a recurrent neural network (RNN) including a long short-term memory (LSTM).

8. The method of claim 6, wherein a length of the feature vector is the same in a case in which the battery is fast-charged and in a case in which the battery is slow-charged.

9. A non-transitory computer-readable storage medium storing instructions that, when executed by one or more processors, cause the one or more processors to perform the method of claim 1.

10. An apparatus for estimating a state of a battery, the apparatus comprising:
one or more processors configured to:
- acquire current information and voltage information of a battery,
- determine time interval values based on the acquired current information such that current integration values corresponding to the time interval values satisfy a condition, wherein the current integration values are equal to each other, and at least one of the time interval values is non-equal to others of the time interval values,
- determine voltage values corresponding to the determined time interval values in the acquired voltage information,
- recognize a voltage variation pattern during a time interval, including two or more of the time interval values, based on the two or more time interval values and voltage values corresponding to the two or more time interval values,
- determine state information of the battery using the recognized voltage variation pattern based on the determined voltage values, and
- output the determined state information to a display.

11. The apparatus of claim 10, wherein the one or more processors are configured to:
- acquire current integration information as an integral of the acquired current information over times,
- divide the current integration information to obtain the current integration values, and
- extract a corresponding time interval value for each dividing point of the current integration values.

12. The apparatus of claim 10, wherein the one or more processors are configured to divide the acquired voltage information based on the determined time interval values.

13. The apparatus of claim 12, wherein:
among dividing points of the divided voltage information, a time interval between a pair of adjacent dividing points of the voltage information is greater than another time interval between another pair of adjacent dividing points, and
each of the time interval and the other time interval comprises one or more of the time interval values.

14. The apparatus of claim 13, wherein a current of the battery decreases in the interval between the portion of dividing points.

15. The apparatus of claim 10, wherein the one or more processors are configured to:
- extract a voltage value corresponding to one or more time interval values associated with a scan order among the determined time interval values from the acquired voltage information,
- generate a feature vector based on the one or more time interval values and the extracted voltage value, and
- input the generated feature value to a state estimation model.

16. The apparatus of claim 15, wherein the state estimation model is based on a recurrent neural network (RNN) including a long short-term memory (LSTM).

17. The apparatus of claim 15, wherein a length of the feature vector is the same in a case in which the battery is fast-charged and in a case in which the battery is slow-charged.

18. A processor-implemented method of estimating a state of a battery, the method comprising:
- acquiring current information and voltage information of a battery;
- determining, based on the current information, current integration values that are equal in value;
- determining time interval values based on the determined current integration values, wherein at least one of the time interval values is non-equal to others of the time interval values;
- recognizing a voltage variation pattern during a time interval, including two or more of the time interval values, based on the two or more time interval values and voltage values corresponding to the two or more time interval values;
- determining state information of the battery using the recognized voltage variation pattern based on voltage values corresponding to the determined time interval values in the acquired voltage information; and
- outputting the determined state information to a display.

19. The method of claim 18, wherein the determining of the state information of the battery comprises:
- generating a feature vector based on one or more time interval values, of the time interval values, and one or more first corresponding voltage values, of the voltage values;
- inputting the feature vector into a long short-term memory (LSTM) to generate an LSTM output vector;
- generating a subsequent feature vector based on one or more subsequent time interval values, of the time interval values, and one or more subsequent corresponding voltage values, of the voltage values;
- inputting the LSTM output vector and the subsequent feature vector into the LSTM to generate a subsequent LSTM output vector; and
- determining state information of the battery by applying a regression analysis to the subsequent LSTM output vector.

20. The method of claim 19, wherein the determining of the time interval values and the corresponding voltage values comprises:
- determining the time interval values to be greater for a slower charging rate of the battery than for a faster charging rate of the battery.

21. A processor-implemented method of estimating a state of a battery, the method comprising:
- acquiring current and voltage information of a battery;
- determining time interval values and corresponding voltage values based on the acquired current and voltage information and based on a charging rate of the battery, wherein current integration values corresponding to the time interval values are equal to each other, and at least one of the time interval values is non-equal to others of the time interval values;

recognizing a voltage variation pattern during a time interval, including two or more of the time interval values, based on the two or more time interval values and voltage values corresponding to the two or more time interval values;

determining state information of the battery using the recognized voltage variation pattern based on the time interval values and the corresponding voltage values; and outputting the determined state information to a display.

* * * * *